(12) United States Patent
Groeschel et al.

(10) Patent No.: US 9,136,881 B2
(45) Date of Patent: Sep. 15, 2015

(54) AUDIO STREAM MIXING WITH DIALOG LEVEL NORMALIZATION

(75) Inventors: Alexander Groeschel, Nuremberg (DE); Phillip A. Williams, Alameda, CA (US); Jarret A. Cooper, San Francisco, CA (US); Wolfgang A. Schildbach, Nuremberg (DE)

(73) Assignees: Dolby Laboratories Licensing Corporation, San Francisco, CA (US); Dolby International AB, Amsterdam (NL)

( * ) Notice: Subject to any disclaimer, the term of this patent is extended or adjusted under 35 U.S.C. 154(b) by 321 days.

(21) Appl. No.: 13/823,482

(22) PCT Filed: Sep. 6, 2011

(86) PCT No.: PCT/US2011/050482
§ 371 (c)(1),
(2), (4) Date: Mar. 14, 2013

(87) PCT Pub. No.: WO2012/039918
PCT Pub. Date: Mar. 29, 2012

(65) Prior Publication Data
US 2013/0170672 A1  Jul. 4, 2013

Related U.S. Application Data

(60) Provisional application No. 61/385,428, filed on Sep. 22, 2010.

(51) Int. Cl.
*H04B 1/00* (2006.01)
*H03G 3/30* (2006.01)

(52) U.S. Cl.
CPC ............. *H04B 1/00* (2013.01); *H03G 3/3005* (2013.01); *H03G 3/3089* (2013.01)

(58) Field of Classification Search
CPC ...... H04R 5/04; H04R 2205/041; H04R 3/00; H04R 3/002; H03G 3/3005; H03G 3/3089; H03G 7/002; H03G 7/007; H04S 1/007; H04S 3/008; H04S 2400/13; H04S 2420/03; H04S 7/30; G10L 19/008; G10L 19/018; H04B 1/00
USPC .................... 381/17–23, 104, 107, 109, 119; 704/225, E19.039, E21.002; 369/1, 4
See application file for complete search history.

(56) References Cited

U.S. PATENT DOCUMENTS 5,867,815 A * 2/1999 Kondo et al. ................. 704/228
6,011,851 A   1/2000 Connor
(Continued)

FOREIGN PATENT DOCUMENTS

JP   2005-032425   2/2005
JP   2010-212760   9/2010
(Continued)

OTHER PUBLICATIONS

Schmandt, Chris "Audio Hallway: A Virtual Acoustic Environment for Browsing" Proc of the 11th annual ACM Symposium on User Interaface Software Technology, pp. 163-170, published in 1998.
(Continued)

*Primary Examiner* — Vivian Chin
*Assistant Examiner* — Jason R Kurr

(57) ABSTRACT

A method for mixing of audio signals that allows maintaining of a consistent perceived sound level for the mixed signal by holding the sound level of the dominant signal in the mix constant by adjusting the sound level of the non-dominant signal(s) in relation to the dominant signal. It further includes receiving of a mixing balance input, which denotes the adjustable balance between the main and associated signals. It further includes identification of the dominant signal from the mixing balance input and mixing metadata, from which an appropriate scale factor for the non-dominant signal may also be determined directly from the scaling information, without the need for any analysis or measurement of the audio signals to be mixed. It further includes scaling the non-dominant signal in relation to the dominant signal and combining the scaled non-dominant signal with the dominant signal into a mixed signal.

20 Claims, 9 Drawing Sheets

(56) References Cited

U.S. PATENT DOCUMENTS

| | | | |
|---|---|---|---|
| 6,230,130 | B1 | 5/2001 | Castello da Costa |
| 6,985,594 | B1 | 1/2006 | Vaudrey |
| 7,180,997 | B2 | 2/2007 | Knappe |
| 7,653,543 | B1 | 1/2010 | Blair |
| 8,284,960 | B2* | 10/2012 | Vaudrey et al. ............... 381/109 |
| 8,577,676 | B2* | 11/2013 | Muesch ........................ 704/225 |
| 8,625,808 | B2* | 1/2014 | Kim et al. ......................... 381/1 |
| 2001/0022841 | A1* | 9/2001 | Motojima et al. .............. 381/27 |
| 2004/0008851 | A1 | 1/2004 | Hagiwara |
| 2006/0023900 | A1 | 2/2006 | Erhart |
| 2007/0274540 | A1 | 11/2007 | Hagen |
| 2008/0037749 | A1 | 2/2008 | Metzger |
| 2008/0084981 | A1 | 4/2008 | Lee |
| 2008/0170703 | A1 | 7/2008 | Zivney |
| 2009/0136063 | A1 | 5/2009 | Xiang |
| 2009/0245539 | A1 | 10/2009 | Vaudrey |
| 2010/0014692 | A1 | 1/2010 | Schreiner |

FOREIGN PATENT DOCUMENTS

| | | |
|---|---|---|
| RU | 2007108494 | 9/2008 |
| RU | 2008114497 | 10/2009 |

OTHER PUBLICATIONS http://www.itu.int/ITU-T/workprog/wp_a5_outaspx ETSI TS 102 366 v1.2.1. (Aug. 2008): Digital Audio Compression (AC-3, Enhanced-AC-3) Standard which describes E-AC-3 (Dolby Digital Plus).

http://www.etsi.org/deliver/etsi_ts/101100_101199/101154/01.09. 01_60/ts_101154v010901p.pdf ETSI TS 101 54 V1..9.1(Sep. 2009):Digital Video Broadcasting.

* cited by examiner

AUDIO STREAM MIXING WITH DIALOG LEVEL NORMALIZATION

CROSS-REFERENCE TO RELATED APPLICATIONS

This application is the U.S. national stage of International Application PCT/US2011/050482, filed 6 Sep. 2011, which in turn claims priority to U. S. Patent Provisional Application No. 61/385,428, filed 22 Sep. 2010, each of which are hereby incorporated by reference its entirety.

TECHNICAL FIELD

This application relates to the field of audio signals. In particular, it relates to the mixing of audio signals.

BACKGROUND

The inclusion of metadata along with audio signals has allowed for significant improvements in the user listening experience. For a pleasant user experience, it is generally desirable for the general sound level or loudness of different programs to be consistent. However, the audio signals of different programs usually originate from different sources, are mastered by different producers and may contain diverse content ranging from speech dialog to music to movie soundtracks with low-frequency effects. This possibility for variance in the sound level makes it a challenge to maintain the same general sound level across such a variety of programs during playback. In practical terms, it is undesirable for the listener to feel the need to adjust the playback volume when switching from one program to another in order to adjust one program to be louder or quieter with respect to another program because of differences in the perceived sound level of the different programs. Techniques to alter the audio signals in order to maintain a consistent sound level between programs are generally known as signal leveling. In the context of dialog audio tracks, a measure relating to the perceived sound level is known as the dialog level, which is based on an average weighted level of the audio signal. Dialog level is often specified using a dialnorm parameter, which indicates a level in decibels (dB) with respect to digital full scale.

In the past, broadcasters working with audio signals had particular problems with audio signals such as soundtracks whose audio levels fell above or below that of other programming, particularly audio that may vary substantially with time, such as dialog. With the development of digital audio, multi-channel audio and particularly the ability to include metadata along with the audio signal, producers and audio engineers now have a wide range of options to specify settings, which can be embedded in the signal as metadata in order to precisely specify playback levels for various playback systems. These settings can even be provided at the postproduction stage, so broadcasters can deliver a very consistent audio signal and ensure that the most important audio elements come through to the end user.

Similarly, when mixing audio signals, it is also desirable for a pleasant user experience to also maintain the same perceived sound level when mixing audio input signals into a single signal. One technique to realize this goal is for the input signals to include mixing metadata that specifies how the signal should be scaled when mixed.

Many current audio standards allow the content producer to include associated audio signals coupled with the main audio signal including time-varying metadata along with associated audio signals. For example, a content producer could provide a track with director's comments with such an associated audio signal. The metadata accompanying the associated signal specifies exactly how the content producer wishes for the audio signal of the main track to be adjusted during mixing for combined playback. For example, E-AC-3 (Dolby Digital Plus) and High-Efficiency Advanced Audio Coding (HE-AAC) are two examples of standards that provide such mixing metadata. For details, see "ETSI TS 102 366 v1.2.1 (2008-08): Digital Audio Compression (AC-3, Enhanced-AC-3) Standard", which describes E-AC-3 (Dolby Digital Plus); or see "ETSI TS 101 154 V1.9.1 (2009-09): Digital Video Broadcasting (DVB); Specification for the use of Video and Audio Coding in Broadcasting Applications based on the MPEG-2 Transport Stream", which describes High-Efficiency Advanced Audio Coding (HE-AAC). Both are hereby incorporated in their entirety by reference.

However, a user may wish to diverge from the producer-provided settings, which are dictated by the metadata transmitted along with the associated signal. For example, a user who activates the director's comments while watching a movie may at some point during playback decide that he would rather hear the original dialog that the producer may have indicated in the metadata to be attenuated in the mixing in order to not override the director's comments.

Thus, there is a need to provide an adjustment that allows the user to adjust the mixing of the input audio signals while also providing for a pleasant user experience by also maintaining the perceived sound level of the mixed signal. Furthermore, there is also a need to provide adjustment of the mixing of the input audio signals while maintaining a consistent perceived sound level for the mixed signal, even if the scaling information from the metadata and an external user input may be time-changing, so that there is no need to perform additional leveling on the mixed signal.

SUMMARY

The use of mixing metadata allows the content producer to precisely control and specify how the signals should be combined during playback. Thereby, the sound level or dialog level of the input audio signals can be normalized prior to mixing by the scaling information provided by metadata, such that each signal input to the mixer is properly scaled to achieve a consistent perceived sound level. In this way, the relative level of each input signal contributing to the mixed signal is controlled during mixing by scaling information contained in metadata, which is provided with the signal. In practice, this technique usually involves the identification of one main signal and one or more associated signals to be mixed. As the names suggest, the main signal is the standard signal, and an associated signal is a signal somehow related to its respective main signal. Consequently, the metadata then provides scaling information for the main signal relative to the associated signal when they are mixed.

For example, often as a special feature, a producer may include an additional "director's commentary" voice track as an associated signal along with a movie, where the user may hear the director's commentary overlaid in real-time on top of the movie. Thus, the user may watch the movie with its original audio and the director's commentary at the same time. During playback, such an associated signal is intended to be mixed with the main audio signal of the original movie, for example on an end-user device such as a set-top box. However, other dialog, effects and music of the movie's main audio signal may be very loud and thus mask the associated audio. Thus, it is generally desirable for the main audio signal of the movie to be reduced, or attenuated, at some times so that the director's commentary can be properly understood over the main audio. This attenuation of the main audio signal may be accomplished, for example, by providing metadata accompanying the additional associated audio signal, in which the metadata specifies exactly in what way and by how much the main signal should be attenuated.

Furthermore, this attenuation may need to be time-varying. For example, in an action movie, it may be necessary in the mixing of the signals to heavily attenuate the main audio signal during very loud scenes, which may include aspects such as speeding cars with screeching tires or exploding planes and missiles, over which it would be difficult for the end user to sufficiently hear the director's comments from the associated signal. For example, the director might want to explain how the major explosion in the action scene was accomplished including guide wires and special remote cameras and how the aspects were synchronized, all while the scene runs in the background. In this case, the content producer may even wish to more heavily attenuate the low frequency effects while still maintaining the normal sound level of the dialog. In other words, high sound levels of certain types of the main audio may at times block out the director's comments. At other times, such as a quiet intimate scene in a movie, the director may wish to maintain the full sound level of the movie, for example, so that the end user can precisely hear the whisper of an important message in a pivotal scene of the movie.

However, the user may want the ability to adjust the settings provided by the content producer. For example, a user who views a movie with the director's comments activated may at some point during playback decide that he would rather place more importance on hearing the original dialog, music, sounds and effects than the director's comments. However, as the metadata settings of the producer may indicate that the main signal should be heavily attenuated in the mixing in order to not override the director's comments, the user has no direct way to modify the mixing settings provided by the content producer (the user could of course increase the volume in order to better hear the attenuated sounds, but with the undesirable effect that the other non-attenuated sounds will also be louder). Thus, there is a need to provide a way to customize the mixing of the input audio signals.

To achieve this function, the user could be provided with an input control to regulate the balance between the main and associated signals. However, as the mixing clearly influences the sound level, without further measures the sound level could easily be de-adjusted in the process, leading to loudness jumps when switching from a program with a mixed signal regulated by a user input to a program with an unmixed audio signal. Furthermore, because the metadata and user input may both be time-varying, without careful handling, the perceived sound level of the mixed signal may be time-varying as well. Thus, there is a further need to scale the main and associated input signals during mixing such that the perceived sound level of the mixed signal of a program remains constant.

In accordance with an aspect, a method is disclosed that allows the maintaining of a consistent perceived sound level for the mixed signal by holding the sound level of the dominant signal in the mix constant, and adjusting the sound level of the non-dominant signal in relation to the dominant signal. The method further includes the receiving of a mixing balance input, which denotes the adjustable balance between the main and associated signals. The method further includes identification of the dominant signal based on the mixing balance input and the mixing metadata. The method may also further include the determining of an appropriate scale factor for the non-dominant signal directly from the scaling information, without the need for any analysis or measurement of the audio signals to be mixed. As these techniques do not require any analysis or measurement of the audio signals, the hardware required to implement the techniques may be much simpler compared to hardware systems that must sample the signal or perform computationally intensive calculations. Likewise, real-time mixing may be achieved with relative ease as all the data are available without having to sample or analyze large amounts of data on the fly.

In accordance with the first aspect, a method of mixing two input audio signals into a single, mixed audio signal with a consistent perceived sound level is provided. The first steps of this mixing method involve the receiving of a main input audio signal, the receiving of an associated input audio signal, the receiving of mixing metadata, which contains scaling information, and the receiving of a mixing balance input, which denotes an adjustable balance between the main and associated signals. From these inputs, the dominant signal is identified based on the scaling information provided by the mixing metadata and the mixing balance input. Then the non-dominant signal is scaled in relation to the dominant signal. Finally, the scaled non-dominant signal is combined with the dominant signal into a mixed signal. Thus, through the use of the mixing balance input, the method makes it possible for the user to influence the mixture by allowing the user to choose the dominant signal as well as the scaling level of the non-dominant signal relative to the dominant signal, while the perceived sound level of the mixed signal is held constant by scaling the non-dominant signal relative to the dominant signal.

According to another aspect, the sound level may be represented by an average weighted level of the signals. The sound level may further be expressed as the dialog level of the signal. Thus, the method may relate to the mixing of two input audio signals into a single, mixed audio signal with a consistent perceived dialog level. Furthermore, the dialog level may be measured by a dialnorm value associated with each signal. Dialnorm is often provided as a meta-data parameter for controlling decoder gain. According to the standards document ETSI TS 102 366 v1.2.1, the "dialnorm" metadata parameter is a 5-bit code ranging from 1 to 31 (the value 0 is reserved). The code should be interpreted as a level ranging from −1 dB to −31 dB with respect to full scale. From the dialnorm metadata parameter, a scaling factor can be determined. The scaling factor is equivalent to (31—dialnorm) dB. Thus, a dialnorm value of 31 indicates a scale factor of 0 dB, while a dialnorm value of 1 indicates a scale factor of −30 dB. In short, dialnorm is an integer value from 31 to 1, where a value of 31 indicates decoder gain remains at unity, and a value of 1 indicates decoder gain is to be reduced by 30 dB.

Provided that the sound level of the dominant signal remains consistent, any variations in the levels of the non-dominant signals will be less noticeable, and the perceived sound level as well as the perceived dialog level of the mixed signal should remain consistent. Preferably, the input signals should be appropriately normalized. Furthermore, attention should be given to the content dialnorm of the input signals when mixing to maintain a consistent perceived dialog level. For best results, the content dialnorm for the input signals should be appropriately set, usually at a dialnorm value of 31, indicating unity gain. However, the dialnorm need not always be set to 31, but the dialogue normalization should preferably already have been applied on both input signals. During mixing, the dominant signal is generally not scaled, while the non-dominant input signal is scaled by the determined scale factor. Therefore, after mixing of dialog audio according to the described methods, the dialog level of the dominant signal will remain consistent while the dialog level of the non-dominant signal relative to the dominant signal will be appropriate, given the scaling information from the mixing metadata and the mixing balance input.

According to another aspect, the mixing balance input may further comprise an external user input providing a value from very large negative values to very large positive values, thereby allowing the mixing to favor either the associated signal or the main signal during the mixing process by the desired amount. In general, the mixing balance input may be a positive or negative real number. This mixing balance input allows the user to adjust the desired signal in focus as desired when mixing two input signals. Furthermore, the mixing balance input allows the user to precisely specify the attenuation of the non-dominant signal relative to the dominant signal in the mixing process, typically allowing the user to choose from the complete range from no attenuation to full attenuation. The application of the methods described herein allows the user to smoothly switch the mixture from full attenuation of the main signal to full attenuation of the associated signal.

In accordance with an aspect, the method may further comprise the step of determining a scale factor with which to scale the non-dominant signal, where the scale factor is determined directly from the scaling information contained in the mixing metadata and the mixing balance input. The method may then further include the scaling of the non-dominant signal using the determined scale factor. Furthermore, the mixing metadata may comprise a metadata scale factor for the main signal, denoting a scale factor for scaling the main signal relative to the associated signal, and the mixing metadata may optionally comprise a metadata scale factor for the associated signal, denoting a scale factor for scaling the associated signal relative to the main signal. The scale factors may further comprise dB values. As the reference sound level for signals is typically specified as a dialnorm setting of 31, for best results, the input signals should also have dialnorm settings of 31.

The method may also further include the step of identifying the dominant signal by performing the following comparison, given there is no metadata scale factor for the associated signal: in the case where the value of the mixing balance input is greater than the metadata scale factor for the main signal from the mixing metadata, then the associated signal is determined to be the dominant signal; otherwise, the main signal is determined to be the dominant signal. If the associated signal is identified to be the dominant signal, the method may further comprise the determining of a scale factor for the main signal, which is calculated as the difference between the metadata scale factor for the main signal from the mixing metadata and the mixing balance input. Alternately, if the main signal is identified to be the dominant signal, the method may further comprise the determining of a scale factor for the associated signal, which is calculated as the difference between the mixing balance input and the metadata scale factor from the mixing metadata for the main signal.

In the case where there is also a metadata scale factor for the associated signal, the method may also further include the step of identifying the dominant signal by performing the following comparison. The metadata scale factor for the main signal from the mixing metadata may be adjusted by the metadata scale factor for the associated signal from the mixing metadata by subtracting the metadata scale factor for the associated signal from the metadata scale factor for the main signal. In the case where the value of the mixing balance input is greater than the adjusted scale factor, then the associated signal is determined to be the dominant signal; otherwise, the main signal is determined to be the dominant signal. If the associated signal is identified to be the dominant signal, the method may further comprise the determining of a scale factor for the main signal, which is calculated as the difference between the adjusted scale factor and the mixing balance input. Alternately, if the main signal is identified to be the dominant signal, the method may further comprise the determining of a scale factor for the associated signal, which is calculated as the difference between the mixing balance input and the adjusted scale factor.

By determining the scale factor for the non-dominant signal and mixing the input signals based on which signal is determined to be the dominant signal, the perceived sound level of the mixed signal can be held constant while still allowing for both the adjustment of the signal in focus as well as the corresponding scaling of the non-dominant signal. In other words, at least one of the signals is always the dominant signal, which is the signal in focus. As the dominant signal is generally not scaled, the sound level of the mixed signal is maintained relative to other programs, regardless of how much the non-dominant signal is attenuated relative to the dominant signal based on the combination of the mixing balance input and the mixing scale factors provided by the metadata.

In some cases, the input signals may consist of multiple channels of audio data. In an alternate embodiment, separate scale factors may be determined for each channel of the main input signal. During mixing, each channel of the non-dominant signal may then be scaled by its correspondingly determined scale factor, and as in the previous embodiment, the dominant signal remains unscaled. Thus, the signals may also comprise multiple channels, where the mixing metadata may then further comprise a primary metadata scale factor for the main signal relative to the associated signal and a metadata scale factor for each channel of the main signal relative to the associated signal.

The multiple channels of the signals may comprise surround channels with left, right, center, left-surround, right-surround and Low Frequency Effect (LFE) channels. The multiple channels may, for example, comprise 5.1 multi-channel signals, 3.1 multi-channel signals, 13.1 multi-channel signals or other multi-channel signals.

For multi-channel signals comprising a Low Frequency Effect (LFE) channel, the method may further comprise the calculating of the scale factor for the LFE channel as the minimum of the LFE metadata scale factor and the maximum metadata scale factor of the other channels of the main signal. This feature is intended to prevent the LFE channel from too strongly dominating the mixed signal.

Particularly useful for input signals comprising multiple channels, the method may further include the identification of the dominant signal from the mixing balance input and the metadata scale factors for the main signal and the metadata scale factor for the associated signal as follows. This method involves the determining of the maximum secondary metadata scale factor as the maximum of all the metadata scale factors for all the channels of the main signal except for the low frequency effects (LFE) channel. Thus, the LFE channel, if present, is not used in determining the maximum secondary metadata scale factor. The method further includes the calculating of the sum of this maximum secondary metadata scale factor and the primary metadata scale factor for the main signal. Then, if the mixing balance input value is greater than this sum, then the associated signal is determined to be the dominant signal; otherwise, the main signal is determined to be the dominant signal. Alternately, in case there is also a metadata scale factor for the associated signal, the above determination of the dominant signal is determined by comparing whether the mixing balance input value is greater than this sum, less the metadata scale factor for the associated signal.

Furthermore, in the case where the associated signal is determined to be the dominant signal, the method may further include the calculating of a scale factor for each channel of the main signal, calculated as the primary metadata scale factor for the main signal plus the metadata scale factor for the corresponding main channel minus the mixing balance input.

In the case where the main signal is determined to be the dominant signal, and there is no metadata scale factor for the associated signal, the method may further include determining a scale factor for the associated signal, calculated as the value of the mixing balance input minus the sum of the primary metadata scale factor for the main signal and the maximum secondary metadata scale factor, which is the maximum of all the metadata scale factors for all the channels of the main signal, except for the low frequency effects (LFE) channel, if present.

In the case where the main signal is determined to be the dominant signal, and there is a metadata scale factor for the associated signal, the method may further include determining a scale factor for the associated signal, calculated as the value of the mixing balance input plus the metadata scale factor for the associated signal minus the sum of the primary metadata scale factor for the main signal and the maximum secondary metadata scale factor, which is the maximum of all the metadata scale factors for all the channels of the main signal, except for the low frequency effects (LFE) channel, if present.

This method may further comprise determining a scale factor for each channel of the main signal, calculated as the primary scale factor for the main channel plus the scale factor for the main channel minus the sum of the primary main scale factor and the maximum secondary metadata scale factor, which is the maximum of all the scale factors for the channels of the main signal, except for the low frequency effects (LFE) channel, if present.

According to a further aspect, the signals may comprise Dolby Digital Plus (DD+) or Dolby Pulse signals. Likewise, the signals may be encoded as E-AC-3, MPEG-4 HE-AAC, aacPlus, AC-3, MPEG-1 Layer 2, MPEG-4 MC, any derivation of MPEG-4 audio signals or other similar audio encoding formats. Thus, the metadata may comprise ES-Level (Elementary Streams) mixing metadata for mixing DD+ signals, for example mixing metadata according to ETSI TS 102 366 V1.2.1 Ch. E.1.2.2. This ES-Level metadata may further comprise scale factors for the channels of a multi-channel signal: extpgmscl, extpgmlscl, extpgmrscl, extpgmcscl, extpgmlsscl, extpgmrsscl, extpgmlfescl, corresponding to the primary scale factor and scale factors for the left channel, the right channel, the center channel, the left surround channel, the right surround channel, and the low-frequency effects (LFE) channel. The ES-Level metadata may optionally further comprise a panmean value. The ES-Level metadata may optionally further comprise a pgmscl value corresponding to the scale factor for the associated signal. In many cases related to DD+ signals, the mixing metadata may be encoded with or embedded in the associated signal, although the various metadata standards and implementations vary. For example, with MPEG-4 HE-MC, the mixing metadata travels alongside, but not strictly inside, the audio data. Consequently, the application of the above techniques should not be limited only to cases where the mixing metadata is contained in the associated signal.

According to another aspect, the metadata may comprise PES-level (Packetized Elementary Streams) mixing metadata for mixing Pulse/HE-AAC signals, as well as E-AC-3, MPEG-4 HE-AAC, aacPlus, AC-3, MPEG-1 Layer 2, MPEG-4 AAC or any derivation of MPEG-4 audio signals, for example mixing metadata according to ETSI TS 101 154 V1.9.1 Annex E2. This PES-level metadata may further comprise scale factors for the channels of a multi-channel signal: AD_fade_byte, AD_gain_byte_center, AD_gain_byte_front, AD_gain_byte_surround or AD_pan_byte, corresponding to the primary scale factor and scale factors for the center, the front, the surround and pan. In many cases involving Pulse signals, the mixing metadata may be directly associated with the associated signal. For instance, the mixing metadata and the associated signal may be transmitted together in the same or related streams. However, the application of the techniques described herein should not be in any way limited to such cases, and the described techniques only require the receiving of mixing metadata that provides scaling information for the main signal relative to the associated signal.

According to another aspect, the method may further include the restriction that the associated signal not contain channels that are not present in the main signal, unless the associated signal is mono. A mono signal may be indicated, for instance, by an "audio coding mode" or acmod value of 1, which indicates that the signal only has a center channel. Nevertheless, the associated signal may further comprise mono and LFE channels, wherein the LFE channel of the associated signal is mixed with the LFE channel of the main signal, and the mono channel of the associated signal is panned on the main channels of main signal, where panning involves the division or distribution of the signal onto multiple channels according to a value specifying how the signal should be distributed, for example, a "panmean" value.

According to another aspect, when the main channel is not mono and thus has left and right channels but the associated signal is mono (i.e. does not have stereo, surround or left-right components), the metadata for the associated signal may further comprise pan metadata information. For example, such pan metadata information may be provided by the metadata key "panmean" in the mixing metadata. The method then includes the use of the pan value to pan the mono associated signal on to the corresponding left and right channels of the mixed signal, where the panmean value specifies a direction from which scale factors for each channel can be computed. Section "E.4.3.5 Panning" of ETSI TS 102 366 v1.2.1 standard provides further details for applying the panmean value. According to this specification, panmean determines the effective angle at which the mono associated signal is to appear within the "space" of the decoded main signal, with 0 degrees being center, +/−90 indicating full pan left or right. Pan may be applied to various multichannel signals such as 3.1, 5.1 and 13.1. The exact range for panmean is 0 to 239, which represents 0 to 358.5 degrees in 1.5 degree steps, and where 0 degrees is the direction of the center speaker. For example, a panmean value of 121 would be applied with the following scale factors on the five non-LFE channels of a 5.1 multi-channel signal: 0.078 left, 0.997 center, 0 right, 0.734 left-surround and 0.679 right-surround.

In yet another alternate embodiment, an additional scale factor may be applied to the dominant signal. This scale factor may be determined from the metadata, from an additional input control or from a fixed value in the mixing device. However, this scale factor could also be determined from real-time analysis of the input signals to even further improve the maintenance of a constant perceived sound level. Another alternative is that an additional scale factor could be derived from the bitstream metadata, e.g. using dialnorm. In some cases, the scale factor is unity, making the mixed signal output from this embodiment identical to the output of previous embodiments. However, in other cases, the scale factor is non-unity, and the mixed signal output from this embodiment will differ from the output of previous embodiments. However, regardless of which embodiment is used, the dialog level of the dominant stream will remain consistent, ensuring that the perceived dialog level of the mixed signal remains consistent. Thus, according to another aspect, the dominant signal may also be scaled by applying a scale factor to the dominant signal. This additional scaling of the dominant signal may serve, for example, to allow for integrating normalization of the input audio signals within the mixing device in the event that the input signals are not normalized prior to mixing.

According to another aspect, the method may further include the step of verifying that the content dialnorm for the input signals is appropriately set and possibly providing an indication when this condition is not met.

According to another aspect, a device for mixing signals is also provided that applies the method of mixing signals described above. Similarly, a decoder is also provided that applies the method of mixing signals described above.

According to another aspect, a processor-readable storage medium is also provided that stores computer-readable instructions to execute the steps of any of the methods described above. Similarly, a processor-readable program product is also provided comprising executable instructions for performing any of the methods described above when executed on a processor.

According to another aspect, a device is also provided for mixing input audio signals into a single, mixed audio signal with a consistent perceived sound level. The device comprises a receiver for receiving a main input audio signal, an associated input audio signal, and mixing metadata with scaling information. The device further comprises a mixing balance input, which denotes the adjustable balance between the main and associated signals. The device further comprises a mixer configured to identify the dominant signal, scale the input signals and combine the signals into a mixed signal. The dominant signal is identified by analyzing the scaling information provided by the mixing metadata and the mixing balance input, and the non-dominant signal is scaled in relation to the dominant signal. Furthermore, a device is also provided for mixing input audio signals into a single, mixed audio signal with a consistent perceived sound level, wherein the scale factor for the non-dominant signal is determined directly from the scaling information from the mixing metadata and the mixing balance input The non-dominant signal is scaled using the determined scale factor, and the scaled non-dominant signal is combined with the dominant signal into a mixed signal.

According to another aspect, a device is provided for mixing input audio signals into a single, mixed audio signal with a consistent perceived sound level, which is further configured to the receive mixing metadata that is integrated with the associated input audio signal. The mixing balance input of the device may further comprise an external user input providing a value from very large negative values to very large positive values. The receiver of the device may be further configured to receive multi-channel signals, wherein the mixing unit is configured to mix the multi-channel signals.

The techniques described above are designed to maintain a consistent perceived sound level for the mixed signal. As such techniques may also be described as signal leveling, the techniques described above that scale the signals may also be viewed in terms of leveling and adjustment of the signal level. Consequently, to generalize the subject matter of the methods for mixing signals based on the result that it achieves, the input signals should be scaled such that the resulting scaling level difference between the scaling of the main signal and the scaling of the associated signal is essentially the sum of the mixing metadata scale factor for the main signal and the mixing balance input value. Likewise, if there is a mixing metadata scale factor for the associated signal, then the resulting scaling level difference between the scaling of the main signal and the scaling of the associated signal is essentially the sum of the difference of the mixing metadata scale factors for the main signal and the associated signal and the mixing balance input value.

With the methods described above, the content author can influence the level difference between the main and associated signals at all times. Consequently, the end user can also influence the level difference between the main and associated signals at all times. Furthermore, when the mixing balance input is at the neutral setting of zero, the signals are mixing exactly as specified by the content author. The techniques described herein provide for smooth control throughout the range of the mixing balance input, all the way from the main signal as the only signal (where the associated signal is fully attenuated) to the other extreme where the associated signal is the only signal present in the playback (where the main signal is fully attenuated). Nevertheless, the dominant signal is leveled, meaning that regardless of the values for the mixing metadata or the mixing balance input, the listener should not perceive a significant change in the sound level when switching to or from another program. Thus, for dialog audio, the dialog in focus can be selected by the user and the dominant dialog is always leveled, as the dominant dialog is associated with the dominant signal.

The methods and devices including examples and embodiments as outlined in the present patent application may be used stand-alone or in combination with the other methods and devices disclosed in this document. Furthermore, all aspects of the methods and devices outlined in the present patent application may be arbitrarily combined. In particular, the features of the claims may be combined with one another in an arbitrary manner as apparent to a person skilled in the art.

BRIEF DESCRIPTION OF FIGURES

The invention is explained below through the use of examples with reference to the accompanying drawings, where the examples are illustrated by the following figures.

DETAILED DESCRIPTION

Figure 1A:
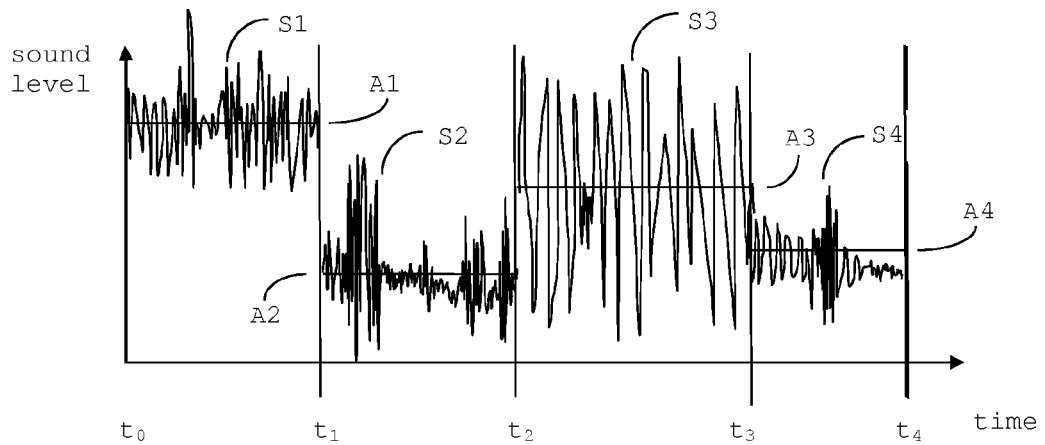
FIG. 1A: shows the sound levels of different audio programs.

It is a common concept to embed audio metadata into a digital audio stream, e.g. in digital broadcast environments. Such metadata is "data about data", i.e. data about the digital audio in the stream. The metadata can provide information to an audio decoder about how to reproduce the audio. Such metadata is typically transmitted along with a digital audio bitstream. This metadata provides unprecedented capability for content producers to deliver the highest quality audio to consumers in a range of listening environments. It also provides choices that allow consumers to adjust their settings to best suit their listening environments.

The techniques described herein can be applied to a large range of audio signal formats and encoding schemes. In order to apply the methods, the signals only need to have metadata accompanying the audio signal that provides mixing information. The input signals can be single channel but will often have multiple channels, for example the well-known 5.1 multi-channel signals with 6 channels: left, right, center, left-surround, right-surround and LFE (low-frequency effects). Two examples of such an audio signal format that allow for such mixing metadata are Dolby Digital Plus (DD+ or E-AC-3 (Enhanced AC-3)) and High-Efficiency Advanced Audio Coding (HE-AAC).

Dolby Digital Plus (DD+ or E-AC-3 (Enhanced AC-3)) is a digital audio compression scheme, which is an enhanced coding system based on the AC-3 codec. E-AC-3 supports up to 13 full range audio channels at a coded bitrate of 6.144 Mbit/s peak. For example, the document ETSI TS 102 366 v1.2.1 describes the DD+ metadata in detail, for example, "E1.3.1.17 extpgmscl: External Programme Scale Factor—6 bits: In some applications, two bit streams may be decoded and mixed together. This field specifies a scale factor that should be applied to the external programme (i.e., a program that is carried in a separate bit stream or independent substream) during mixing. This field uses the same scale as pgmscl." The most relevant mixing metadata comprises the following metadata keys: extpgmscl, extpgmlscl, extpgmrscl, extpgmcscl, extpgmlsscl, extpgmrsscl, extpgmlfescl, pgmscl. In some cases, for example when the associated audio signal is mono, the metadata key panmean may also be used.

High-Efficiency Advanced Audio Coding (HE-AAC) is a lossy data compression scheme for digital audio defined as a MPEG-4 Audio profile in ISO/IEC 14496-3. It is an extension of Low Complexity MC (MC LC) optimized for low-bitrate applications such as streaming audio. HE-AAC version 1 profile (HE-AAC v1) uses spectral band replication (SBR) to enhance the compression efficiency in the frequency domain. HE-MC version 2 profile (HE-MC v2) couples SBR with Parametric Stereo (PS) to enhance the compression efficiency of stereo signals. It is a standardized and improved version of the AACplus codec. The most relevant mixing metadata comprises the following metadata keys: AD_fade_byte, AD_gain_byte_center, AD_gain_byte_front, AD_gain_byte_surround, and AD_pan_byte. HE-MC is used in digital radio standards like DAB+ and Digital Radio Mondiale.

In order to take full advantage of its capabilities, content authors, or producers, should have a solid grasp of audio metadata, which is typically added during production or post-production.

As described in the Background section, in order to maintain consistent sound levels of different programs, most modern audio signals include metadata, such as a dialog level, which is used to scale the audio signal. Such scaling allows for each signal to be appropriately represented in a form allowing for high quality and good compression while also maintaining the same sound level. FIG. 1a shows an example of different programs without such leveling or dialog level normalization. As can be seen from the diagram, the sound level of the programs differs, such that the listener may perceive a different sound level when switching from one program to another. FIG. 1a illustrates the sound levels of four different programs S1, S2, S3 and S4, for example in cases where the user switches the channel or a new program is transmitted at times t0, t1, t2, and t3. The progression of time is shown on the horizontal axis and the sound level on the vertical axis. Horizontal line A1 shows the sound level of program 51, which runs from time t0 to t1. Horizontal lines A2, A3 and A4 likewise show the sound levels of program S2, S3 and S4, respectively, which run from times t1 to t2, t2 to t3 and t3 to t4. As can be seen, the sound level A1 is higher than the sound levels A2, A3 and A4.

Figure 1B:
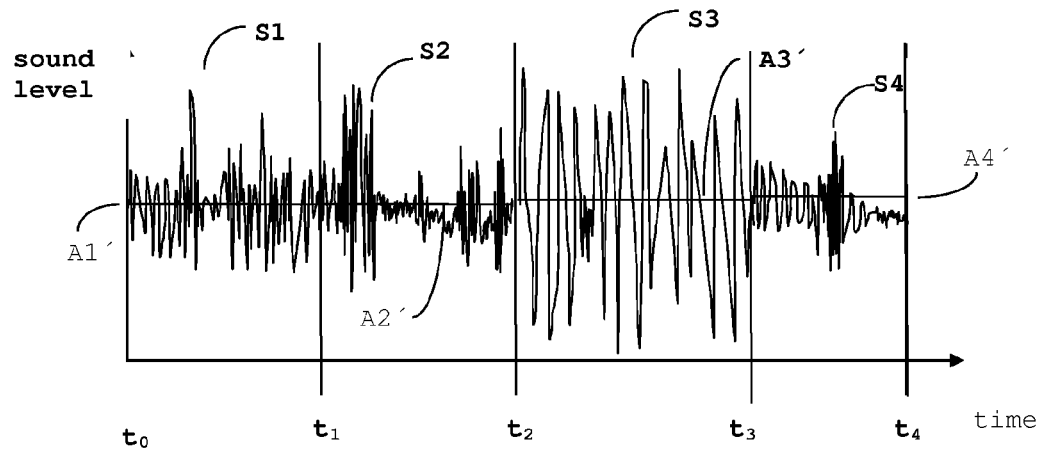
FIG. 1B: shows the sound levels of different audio programs after leveling.

To correct such a difference in the sound level, the program signals are leveled, or scaled to a common reference level. Thus, FIG. 1b shows the program signals after being leveled to a common reference sound level. The reference sound level for signals is typically represented as an average weighted level, which is often specified in the metadata as a dialnorm setting of 31. As can be seen in FIG. 1b, the sound levels A1', A2', A3', and A4' are all the same. Thus, the user does not perceive a significant change in the sound level when switching between programs.

Many new audio signal formats now also allow for one or more associated signals to be grouped with the main signal. These audio signals may be activated based on either device setting or user selections, for example during playback. Typically, such activation involves the combining of the associated signal with its corresponding main signal. This combining of the signals into one signal is referred to as mixing. For example, a producer may provide a director's commentary track on a soundtrack, for example on a DVD video. The listener may then use the set-top box or DVD player to activate this associated track, which is then overlaid and mixed with the main signal. In order to maintain the same perceived sound level as other programs, such an associated signal usually contains metadata that specifies how the signals should be mixed. This mixing metadata allows the producer to precisely control the mixture of the signals by providing specific details for how to mix the signals, often also including the option to specify details for mixing multi-channel signals.

Although the mixing metadata describes the mixing levels envisioned by the producer, the listener may at some time have a different wish concerning how the signals should be mixed. Thus, the listener may decide he would like the other signal to be the "dialog in focus". Thus, the "dialog in focus" is the signal that should dominate in the mixed signal. However, this "dialog in focus" is somewhat subjective. The content author has an idea of which signal should be in focus, but it is desirable for the user to also have some control over it as well. According to the teachings of this application, the indication of "user focus" can be achieved by the offering of a mixing balance control input for adjusting the mixing of the main and associated signals.

Thus, for the case where the user would like to deviate from the signal weighting specified by the metadata by adjusting the mixed signal to favor one signal or the other, an embodiment includes the providing of a mixing balance control to enable the input of the mixing balance input. This mixing balance control allows the user to indicate that one of the signals should be more present in the mixed signal and to what extent the signal should be more prevalent. Additionally, this mixing balance input gives the user immediate control over the signal in focus. In the standard position, the mixing balance control is neutral, which indicates that the mixing should occur as specified in the metadata. When the mixing balance control is turned in one direction (in this embodiment, in the negative direction), the main signal is made louder relative to the associated signal. When the balance control is turned in the other direction (in this embodiment, in the positive direction), the associated signal is made louder relative to the main signal.

However, when such a mixing balance control or mixing balance input is then used to increase or decrease the levels of the main and associated signals, it is likely that the sound level, or perceived dialog level, of the mixed signal will be thereby altered. Thus, it is likely that switching between programs with and without an activated associated signal would again result in an undesirable situation like that described in FIG. 1a. Thus, there is a need to provide a technique of mixing the associated and main signals under the influence of a mixing balance input, so that the perceived sound level of the mixed signal is also held constant.

Figure 2:
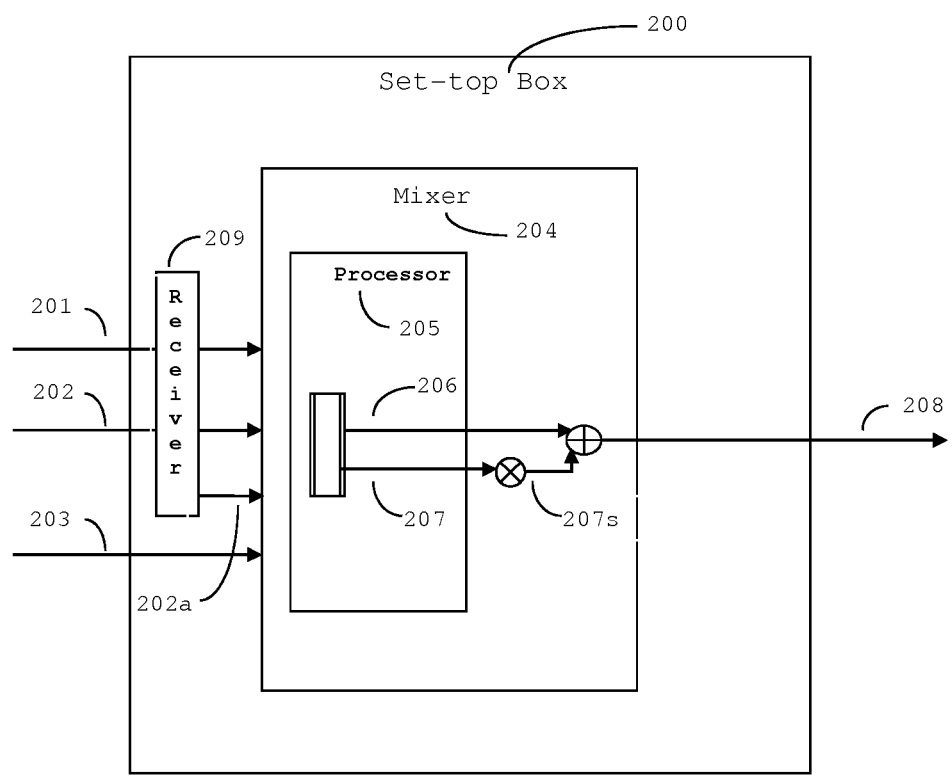
FIG. 2: shows a block diagram of a Set-Top Box with a Mixer.

The techniques described herein can be implemented in many embodiments, such as a set-top box, a portable or non-portable audio player, a mixing device, a DVD player, a television, a smartphone, or a TV-receiving device for a computer system. Furthermore, the individual aspects can be implemented in a combination of hardware and software systems. The components of one concrete embodiment will be described in more detail based on a set-top box including a mixer according to the techniques described herein. This embodiment set-top box is illustrated in FIG. 2. The set-top box 200 comprises a receiver 209, a mixer 204 and a processor 205. Although this example is shown with these components, the application of the techniques described herein should not be limited to this exact configuration. For example, the receiver 209 could be integrated into the mixer 204; furthermore, the set-top box 200 need not have a processor, as the functionality could be performed by traditional electronic circuits. In this example, the receiver 209 of the set-top box 200 is configured to receive the main input signal 201 and the associated input audio signal 202, including the corresponding metadata. In some cases, the receiver may need to be further adapted to receive the mixing metadata that may be transmitted or encoded separately. If necessary, the receiver 209 may be further configured to decode the input signals 201, 202 and the corresponding mixing metadata 202a according to the encoding of the signals. In addition, the set-top box 200 and the mixer 204 are also configured to receive the mixing balance control input 203. Optionally, the receiver 209 may also be configured to perform special decoding of the mixing balance control input 203. There are various options for the further characteristics and exact implementation of the mixing balance control input 203. For example, the set-top box 200 could link this input with a remote control device to allow the user to set this mixing balance level via a menu accessed by a remote control device. Of course, the set-top box 200 or its remote control could realize the mixing balance control input with a dedicated element, such as an input dial, plus and minus keys or a similar input device. The set-top box 200 and mixer 204 could of course also be configured to receive the mixing balance input 203 as a signal from another system or device. In any case, the dominant signal 206 is the input signal that is identified by the processor 204 of the mixer 205 based on the main input signal 201, the associated input audio signal 202, the mixing metadata 202a and the mixing balance control input 203. Thus, the non-dominant signal 207 is the other input signal that is not determined to be the dominant signal 206. Then the scaled non-dominant signal 207s is the non-dominant signal 207 after it is scaled. Finally, the dominant signal 206 and the scaled non-dominant signal 207s are mixed as the mixed signal 208.

Figure 3:
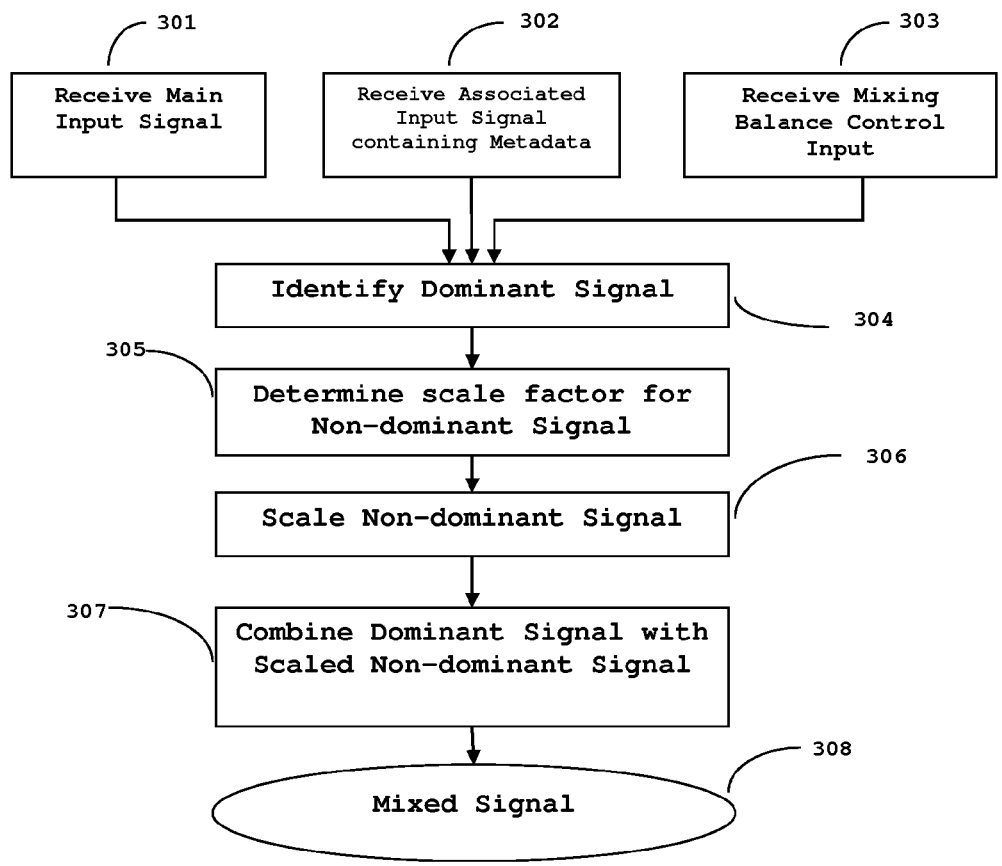
FIG. 3: shows a process diagram for identifying the dominant signal and mixing input signals.

One example solution to achieve this goal for the mixing of the audio signals based on the configuration of FIG. 2 is illustrated in FIG. 3. Thus, the inputs consist of a main input signal 201, an associated input signal 202 and a mixing balance control input 203. First, in step 301 the main input signal 201 is received by the mixer 204, set-top box 200 and/or receiver 209. In step 302, the associated input signal 202 is received, including the mixing metadata 202a. Note that the inclusion of the mixing metadata 202a in the associated signal 202 is only for this example and should not be interpreted as limiting the application of the techniques as other standards and signal encoding formats may differ. In step 303, the mixing balance input 203 is received. These steps include any special decoding that the format of the signals may require. Next, in step 304 the scaling information from the mixing metadata 202a and the mixing balance control input 203 are used for identifying the dominant signal 206 from the input signals 201, 202 to be mixed. This step may be performed by a common electronic device or circuit as it does not require any high-powered computation, measurement, in-depth analysis or sampling of the input signals. Then, in the optional step 305, a scale factor for the non-dominant signal 207 may be determined directly from the mixing metadata 202a and the mixing balance input 203. In step 306, the non-dominant signal 207 is scaled. In the case where a scale factor for the non-dominant signal 207 was determined in step 305 based on the mixing metadata 202a and the mixing balance input 203, step 306 includes the scaling of the non-dominant signal 207 according to the scale factor determined in step 305. Finally, in step 307 the scaled non-dominant signal 207s is combined with the dominant signal 206 as the mixed signal 208 of the end step 308.

Figure 4:
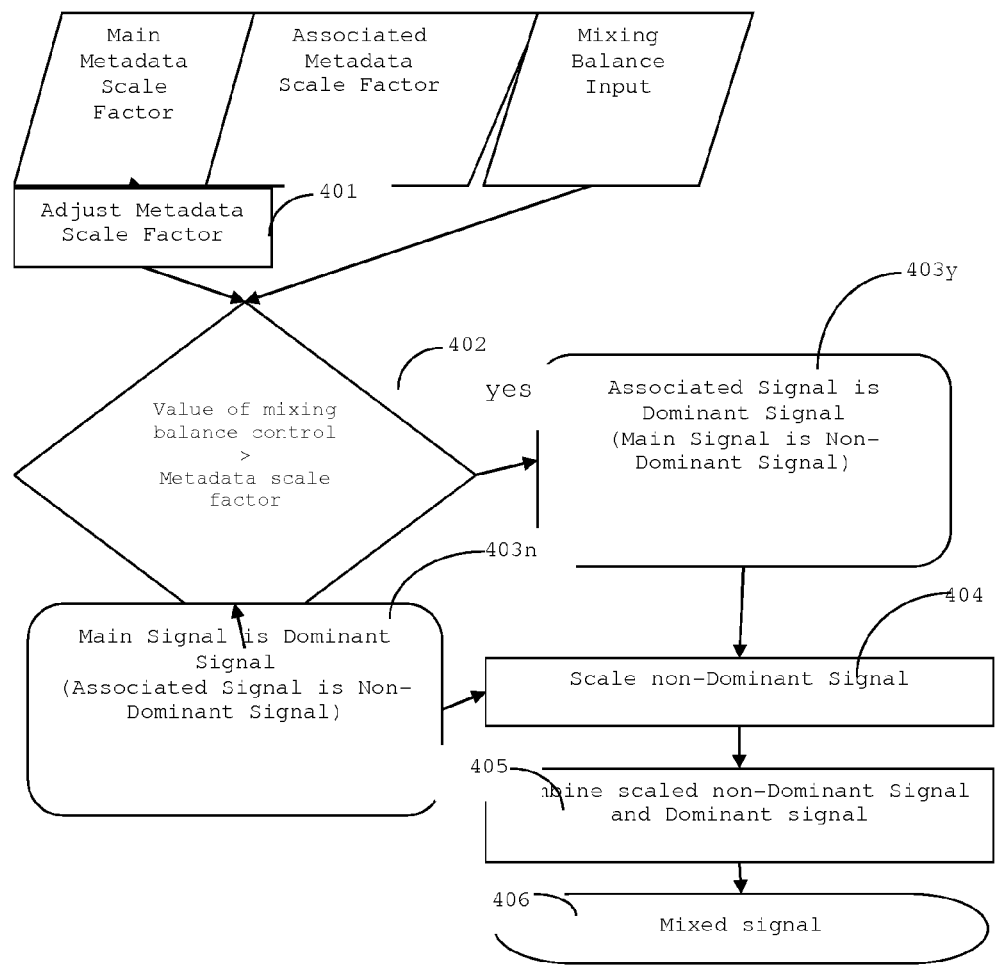
FIG. 4: shows a flowchart for identifying the dominant signal and mixing.

A further embodiment includes the optional step 305 for the determination of the scale factor for the non-dominant signal 207 based directly on the mixing metadata 202a and the mixing balance input 203. FIG. 4 shows a flow chart for this determination for this further embodiment. The identification of the dominant signal 206 is based on the mixing balance input 203 and the mixing metadata 202a. In some cases, the mixing metadata may also contain a scaling factor for the associated signal. If this metadata value is present, then it may be used to adjust the metadata factor for mixing the signals. Thus, in the optional step 401, the scale factor for the main signal may be adjusted by subtracting the scale factor for the associated signal from the scale factor for the main signal. In step 402, the value of the mixing balance input 203 is compared to the adjusted metadata scale factor. In the case where the scale factor is not adjusted in step 401, the value of the mixing balance input 203 is compared to the scale factor for the main signal from the mixing metadata 202a. For the "yes" case where the mixing balance input 203 is greater than the mixing metadata scale factor 202a, then in step 403y the associated signal 202 is determined to be the dominant signal 206 and the main signal 201 is the non-dominant signal 207. Otherwise, for the "no" case where the value of the mixing balance input 203 is less than or equal to the mixing metadata scale factor 202a, then in step 403n the main signal 201 is determined to be the dominant signal 207 and the associated signal 202 is the non-dominant signal 207. Both steps 403y and 403n are followed by step 404, where the non-dominant signal 207 is then scaled. In step 405, the dominant signal 206 is combined with the scaled non-dominant signal 207s, to form the mixed signal 208 of step 406.

FIG. 5 shows a plot illustrating a concrete example of the scale factors that are to be applied to the main and associated signals 201, 202 when mixing the associated signal 202 with the main signal 201. In this example, the scale factor of the mixing metadata 202a of the associated signal 202 specifies that the main signal 201 should be scaled by −10 db. This −10 dB scale factor for scaling of the main signal 201 when mixed with the associated signal 202 indicates the desired mixing relationship set by the content producer during mastering. The horizontal axis of FIG. 5 shows the mixing balance input 203 as it varies from negative infinity to positive infinity. The vertical axis indicates the scale factor in dB from to −∞dB to 0 dB from bottom to top. The two plots of FIG. 5 show the scale factors for the two input signals plotted for all values of the mixing balance input from −∞dB to +∞db (the values of the mixing balance input are on the horizontal axis). The two line plots, one with a dashed line and the other with a dotted line, represent the scale factors for the main signal 201 and the associated signal 202, respectively. Thus, the plot with the dashed line 501a, 501b shows the main signal, and the plot with the dotted line 502a, 502b shows the associated signal. As can be seen, when the mixing balance input 203 is at its neutral setting, i.e. zero dB, the balance input 203 has no effect and the scale factor is as specified in the metadata 202a: in this example where the specified metadata scale factor is −10 dB, indicating the amount of attenuation of the main signal relative to the associated signals, the associated signal 202 is therefore the dominant signal 206 and is not scaled, and the main signal 201 is scaled according to the metadata scale factor of −10 dB. However, as can be seen from the figure, if the balance input 203 is made more negative than the mixing metadata scale factor, i.e. less than −10 dB, then the main signal 201 becomes the dominant signal 206. Furthermore, which of the input signals is the dominant signal is further indicated in FIG. 5 by the labels 501a, 501b and 502a, 502b, where the horizontal line 501a represents the main input signal 201 when it is the dominant signal 206, the diagonal line 501b represents the main input signal 201 when it is the non-dominant signal 207, the horizontal line 502b represents the associated input signal 202 when it is the dominant signal 206, and the diagonal line 502a represents the associated input signal 202 when it is the non-dominant signal 207.

Figure 5A:
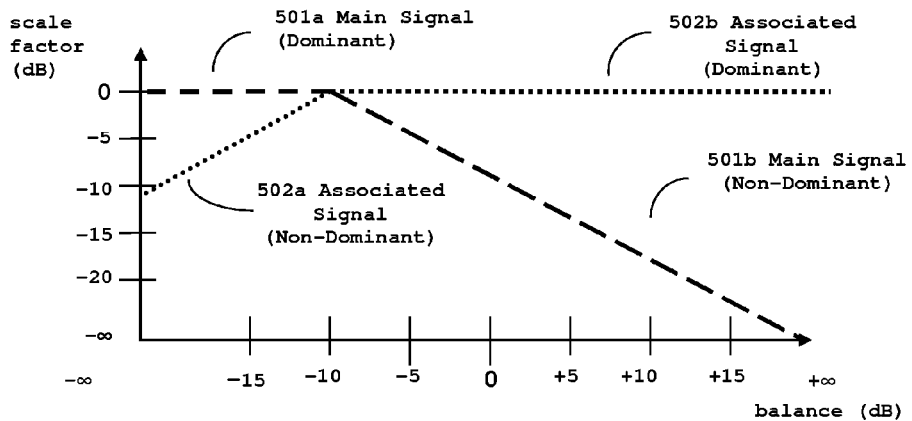
FIG. 5A: shows a plot of the scale factors for the main and associated signals, where for the case where the mixing metadata scale factor is −10 dB.

For a specific example for reading the scale factors of the case in FIG. 5, FIG. 5a shows the scale factors for the case where the mixing balance input 203 has a value of +5 dB and, as in FIG. 5, the mixing metadata scale factor for the main signal is −10 db. From the figure, the scale factor 501a for the main signal 201 can be seen to be −15 dB, which is −10 dB−5 dB=−15 dB. The scale factor 502a for the associated signal 202 is 0 dB. As the associated signal 202 is the dominant signal 206, it is expected that the scale factor for the associated signal 202 should be unity. Thus, if the balance input 203 is increased to favor the associated signal 202, then the associated signal 202 remains the dominant signal 206, the associated signal 202 is not scaled and only the main signal 201 is scaled.

Figure 5B:
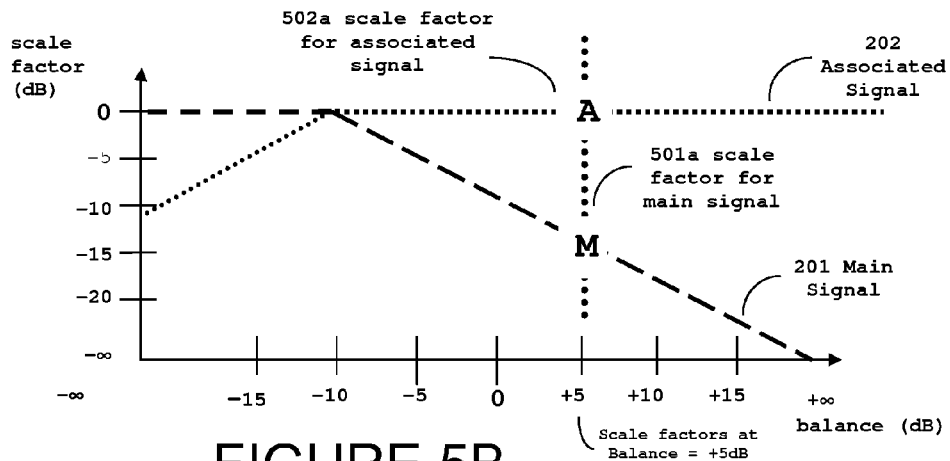
FIG. 5B: shows an example for reading the scale factors of FIG. 5A of the main and associated signals where the mixing metadata scale factor is −10 dB for the case where the mixing balance input is +5 dB.

On the other hand, FIG. 5b shows the scale factors for the case of FIG. 5 where the mixing balance input 203 has a value of −15 dB and, as in FIG. 5, the mixing metadata scale factor for the main signal is −10 dB. From the figure, it can be seen that the scale factor for the main signal 501b is 0 dB so the main signal 201 is not scaled, as it is the dominant signal 206 and that the associated signal 202 is scaled by the associated scale factor 502b of −5 dB, which is the −15 dB−(−10 db)=−5 dB.

Figure 5C:
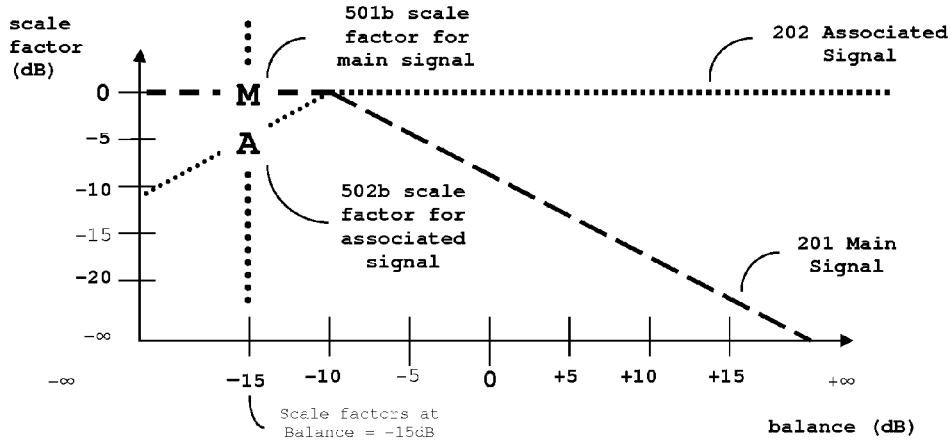
FIG. 5C: shows an example for reading the scale factors of FIG. 5A of the main and associated signals where the mixing metadata scale factor=−10 dB for the case where the mixing balance input is −15 dB.

Furthermore, from FIGS. 5A, 5B and 5C, it can be seen that when the mixing balance input 203 is set to plus infinity, the main signal 201 is completely attenuated and the associated signal 202 is not scaled. Conversely, when the mixing balance input 203 is set to negative infinity, the main signal 201 is not scaled and the associated signal 202 is completely attenuated.

The methods described herein may also be applied for mixing multi-channel signals. As the mixing metadata for multi-channel signals may have many different forms, as there may be 2 to 14 different channels in common multi-channel signals (e.g. 2 channels for stereo, 2 channels for mono+LFE, 4 channels for 3.1, 6 channels for 5.1, and 14 channels for 13.1), the method will be described here through the use of generic metadata keys. In practice, the person skilled in the art will need to substitute the generic metadata listed below for those appropriate for the particular encoding used by the signals. Thus, the generic terms "sclmain", "scl[ch]" and "pan" are used below, where "sclmain" is the primary scale factor, "scl[ch]" is the scale factor for each individual channel where [ch] is an index for the channel and "pan" is an optional value indicating how the channels should be applied to a mixture with a different number of channels (e.g. how a mono signal should be applied to a 5.1 signal, for example as 50% of the mono signal on the left channel, 50% on the right channel or 0% on the other channels, or 60% on the left channel, 40% on the center channel and 0% on the right, LFE and surround channels).

Table 1 shows a generalized representation of the mixing metadata (common for ES and PES), with column one showing the generic metadata keys, column two showing the corresponding metadata for ES (e.g. for Dolby Digital Plus or DD+) and column three showing the corresponding metadata for PES (e.g. for Dolby Pulse or DVB):

TABLE 1

| Generalized | ES (DD+) | PES (DVB) |
| --- | --- | --- |
| sclmain | extpgmscl | AD_fade_byte |
| sclasso | pgmscl | — |
| scl[ch] | extpgmlscl, extpgmrscl, extpgmcscl, extpgmlsscl, extpgmrsscl, extpgmlfescl | AD_gain_byte_center, AD_gain_byte_front, AD_gain_byte_surround |
| pan | panmean | AD_pan_byte |

For the following section and the pseudo code below, the expression "pref" denotes the mixing balance input value 203 for adjusting the balance between the main 201 and associated signals 202. The value of mixing balance control input 203 shall have a range of [−∞ . . . +∞], with −∞ leading to complete attenuation of the associated signal 202, 0 being a neutral value leading to mixing according to the mixing metadata 202a, and ∞ leading to complete attenuation of the main signal 201.

For this example involving a 5.1 multi-channel main signal 201 and a 5.1 multi-channel associated signal 202, the application of the techniques for a multi-channel signal results in the following pseudo code, with gainA and gainM [ch] being the effective gains or scale factors applied on the associated signal 202 and the channels of the main signal 201, respectively.

The pseudo code below operates in the dB domain.

```
maxscl = max (scl[c], scl[l], scl[r], scl[ls], scl[rs]);
mainscltotal = sclmain + maxscl;
scl[lfe] = min(scl[lfe], maxscl);
if (pref > mainscltotal − sclasso ) {
    gainA =0;
    gainM[ch] = sclmain + scl[ch] − pref − sclasso ;
} else {
    gainA = pref − mainscltotal + sclasso;
    gainM[ch] = sclmain + scl[ch] − mainscltotal;
}
```

This pseudo code is executed for each channel of the input signals.

Thus, when the mixing balance is at its maximum value of +∞ dB, the associated signal 201 is the dominant signal 206, so the main signal 201 is fully attenuated, and the mixed signal 208 is essentially the unscaled associated signal 202. In contrast, when the mixing balance 203 is at its minimum value of −∞ dB, the main signal 201 is the dominant signal 206, so the associated signal 202 is fully attenuated and the mixed signal 208 is essentially the unscaled main signal 201.

Note that in this particular example, the dominant signal may be also slightly scaled in the case where the main signal is the dominant signal (line gainM[ch]=sclmain+ scl[ch]−mainscltotal in the else clause). This allows the algorithm to prevent positive gain from being applied to the main signal, which is possible with DD+ metadata. The end result should be that main's loudest channel is limited to 0 dB, which roughly matches with the general principle that the dominant signal should have a gain of unity.

To apply this pseudo code to a specific metadata standard, the appropriate metadata terms must be substituted for the generic variables such as scl[ch]. Thus, based on the specific form of the signals, including the number of channels, the type of encoding and the metadata available in the signals, the person skilled in art should be able to map the appropriate generalized metadata keys for a specific case. For some specific cases not all of the metadata keys listed above may be relevant. For example, for mixing two 5.1 multi-channel signals, the person skilled in the art should be able to determine that the pan metadata is either not present or should be ignored as the associated signal already contains the exact same channels as the main signal.

For the case where the associated signal 202 is mono and the main signal 201 is not, panning gains may have to be applied to the associated signal 201. In this case, if the associated signal 201 has an LFE channel, the LFE channel may be mixed as described in the pseudo code above as scl[lfe].

For mixing DD+ using ES-Level mixing metadata, the following ES-level mixing metadata keys shall be used:
extpgmscl, panmean, extpgmlscl, extpgmrscl, extpgmcscl, extpgmlsscl, extpgmrsscl, extpgmlfescl, pgmscl.

In general, all other mixing metadata is not needed in the mixing. The metadata key dmxscl may be additionally used for downmixing, where downmixing is the mapping of the signal to a format with a different number of channels. The metadata key pgmscl, which represents a scale factor for the associated signal, may be additionally used to adjust the metadata scale factors for the main channel during mixing. For the pseudo code above, the variable sclas so represents pgmscl. From the line of pseudo code, if (pref22 mainscltotal−sclasso), it can be seen that sclasso, which represents the metadata key pgmscl in DD+, then influences the if comparison where the dominant signal is determined, because sclasso is subtracted from mainscltotal before comparison with pref. The use of sclasso is, however, optional, and if sclasso is not present or it is not desired to use the value, then pref is simply compared to mainscltotal.

For mixing Dolby Pulse/HE-AAC using PES level mixing metadata, for example in DVB, the following ES-level mixing metadata keys shall be used:
AD_gain_byte_center, AD_gain_byte_front, AD_gain_byte_surround.

For best results the maximum resulting gain of each
[AD_gain_byte_center+AD_fade_byte],
[AD_gain_byte_front+AD_fade_byte],
[AD_gain_byte_surround+AD_fade_byte]
shall not be higher than +12 dB, and these effective gains should be normalized in a way that the highest gain does not exceed 12 dB, while the relations between
AD_gain_byte_center, AD_gain_byte_front, AD_gain_byte_surround
shall be maintained, i.e.
AD_fade_byte=min(12 dB, AD_fade_byte+max(AD_gain_byte_center, AD_gain_byte_front, AD_gain_byte_surround)).

Figure 6:
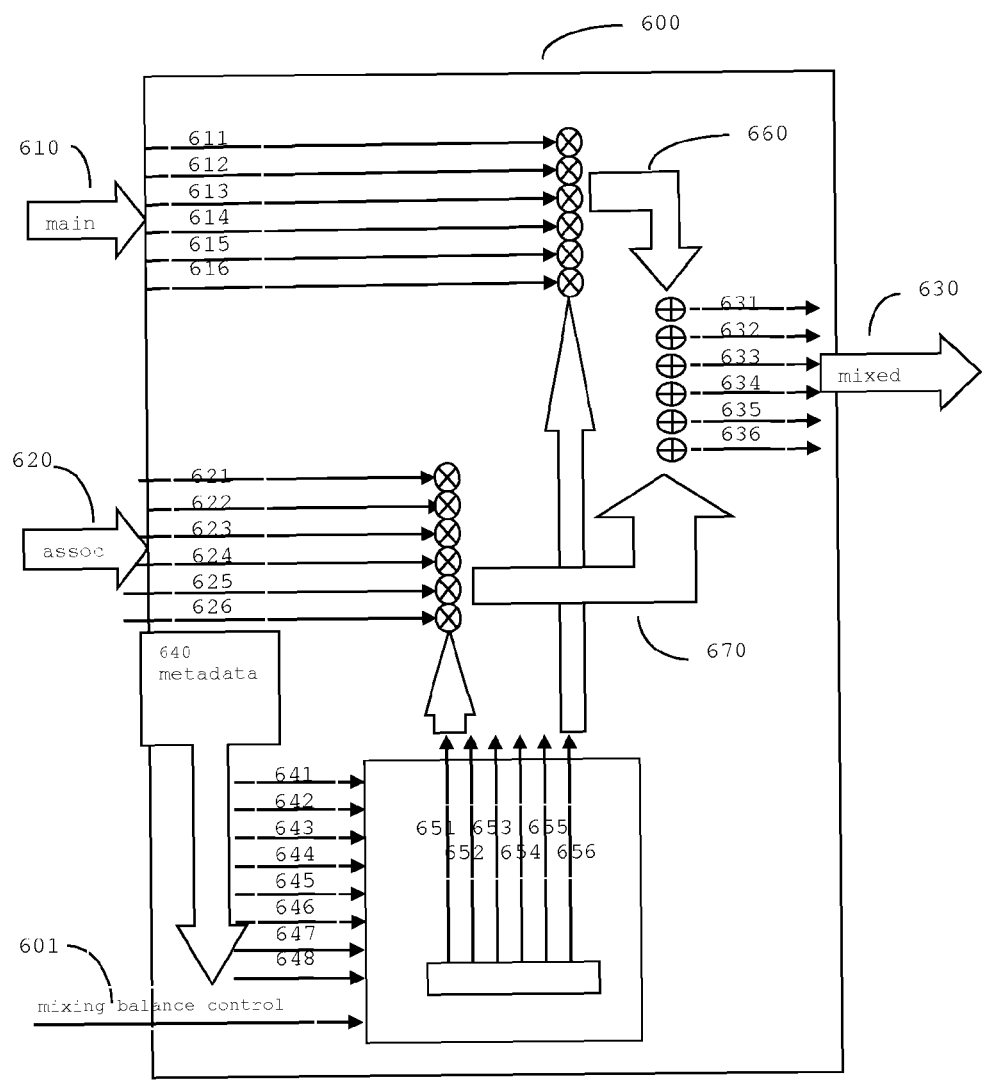
FIG. 6: shows a signal block diagram for mixing of 5.1 multi-channel signals.

FIG. 6 shows a further embodiment of a mixer 600 for mixing a 5.1 multi-channel main signal 610 with a 5.1 multi-channel associated signal 620 including mixing metadata 640, for example Dolby Digital Plus (DD+ or E-AC-3 (Enhanced AC-3)) signals. The inputs include a mixing balance input 601, a main signal 610 and an associated signal 620 with mixing metadata 640. In this example, the input main signal 610 and the output mixed signal 630 are 5.1 multi-channel signals containing six channels: left, right, center, left-surround, right-surround and LFE (low-frequency effects). Thus, the main input signal 610 comprises the six channels: left 611, right 612, center 613, left-surround 614, right-surround 615 and LFE (low-frequency effects) 616. The associated signal 620 also comprises six channels: left 621, right 622, center 623, left-surround 624, right-surround 625 and LFE (low-frequency effects) 626. The mixing metadata 640 also comprises a primary scale factor 647 and scale factors for the six channels: left 641, right 642, center 643, left-surround 644, right-surround 645 and LFE (low-frequency effects) 646. In some cases, the mixing metadata may further comprise a scale factor for the associated signal 648. If this scale factor for the associated signal is not present then it is ignored or treated as unity or 0 dB. The mixer 600 is also configured to receive the input from the mixing balance input 601. Based on the mixing metadata 640 and the mixing balance input 601, scale factors for each channel 651, 652, 653, 654, 655, 656 are determined based on the logic in the pseudo code above and also shown in FIG. 7A, which is a flowchart describing how the scale factor for each channel is determined. From the mixing scale factors 651, 652, 653, 654, 655, 656, each channel of the input signals is scaled, where primary scaling occurs on the non-dominant signal and the dominant signal is only minimally scaled or not scaled at all. Finally, corresponding channels of the scaled channel signals 660, 670 are combined into mixed channels, and the six mixed channels 631, 632, 633, 634, 635, 636 then comprise the 5.1 mixed output signal 630. Thus, the output mixed 5.1 signal 630 also comprises six channels, left 631, right 632, center 633, left-surround 634, right-surround 635 and LFE (low-frequency effects) 616, which are each calculated according to the logic of FIG. 7A.

Figure 7A:
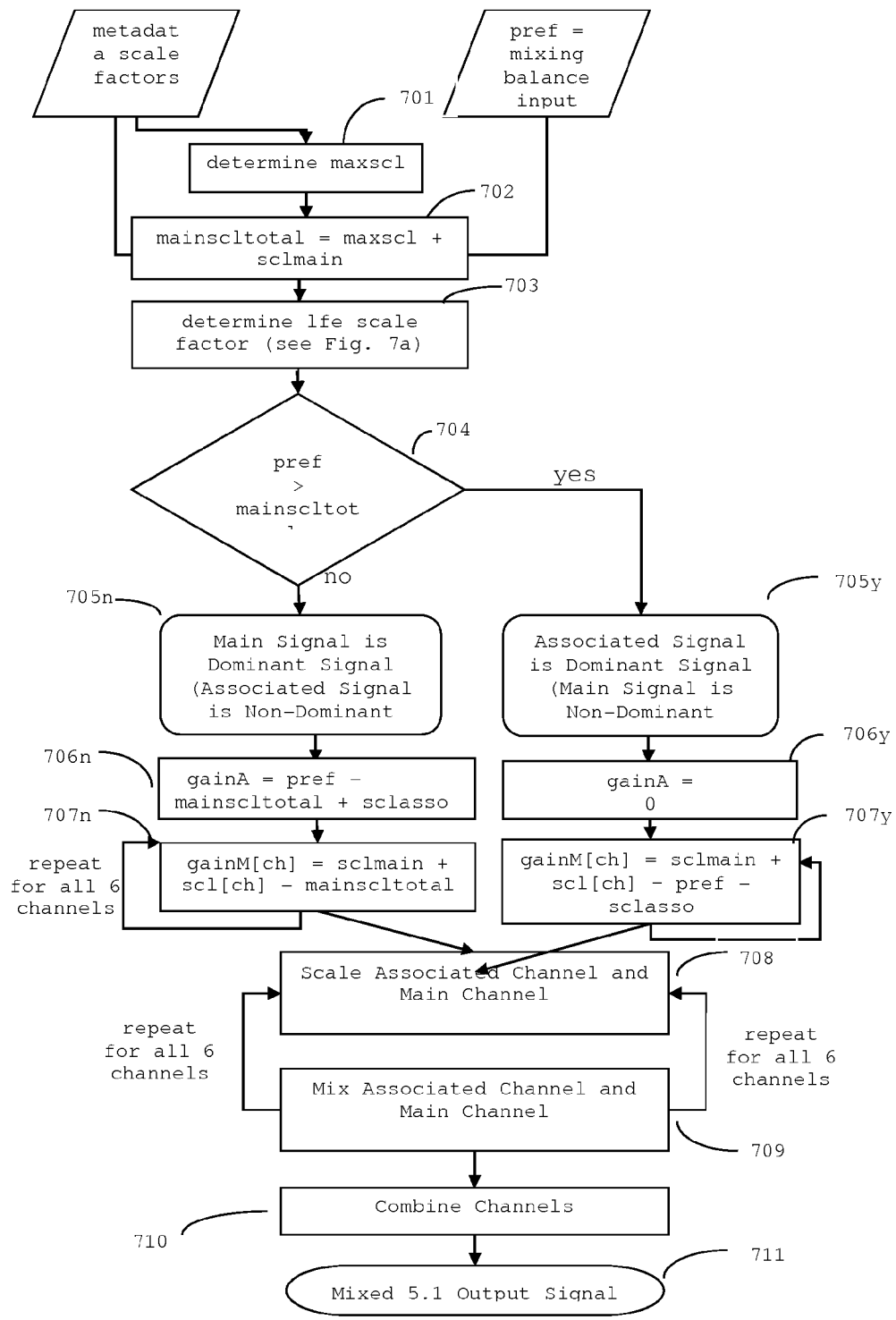
FIG. 7A: shows a flowchart of an example for mixing 5.1 multi-channel signals.

FIG. 7A shows a flowchart describing the example of FIG. 6 for mixing a 5.1 multi-channel input main signal 610 with a 5.1 multi-channel input associated signal 620, where the dominant signal 206 may also be slightly scaled if the main signal 610 is the dominant signal 206. As shown in FIG. 6, the inputs comprise a mixing balance input 601, a main signal 610 and an associated signal 620 with mixing metadata 640, where the input signals and the mixed output signal 630 are 5.1 multi-channel signals. Thus, the signals 610, 620, 630 comprise six channels and the mixing metadata 640 comprises a primary scale factor 647 and scale factors for the six channels: left 641, right 642, center 643, left-surround 644, right-surround 654 and LFE (low-frequency effects) 646. In some cases, the mixing metadata 640 may further comprise a scale factor for the associated signal, sclasso 648. If sclasso 648 is not present or not desired to be used in the mixing, a value of 0 dB is used for sclasso 648, and no adjustment of the other scale factors is made. In step 701, the maximum scale factor of the five "normal channels", left 641, right 642, center 643, left-surround 644 and right-surround 645, is determined as "maxscl". Then, in step 702, mainscltotal is calculated as the sum of the sclmain 647 and maxscl, where sclmain 647 is the primary scale factor of the mixing metadata, maxscl is the maximum of the scale factors of the normal channels 641, 642, 643, 644, 645. Step 703 in which the LFE scale factor is determined is described in more detail in FIG. 7a.

Figure 7B:
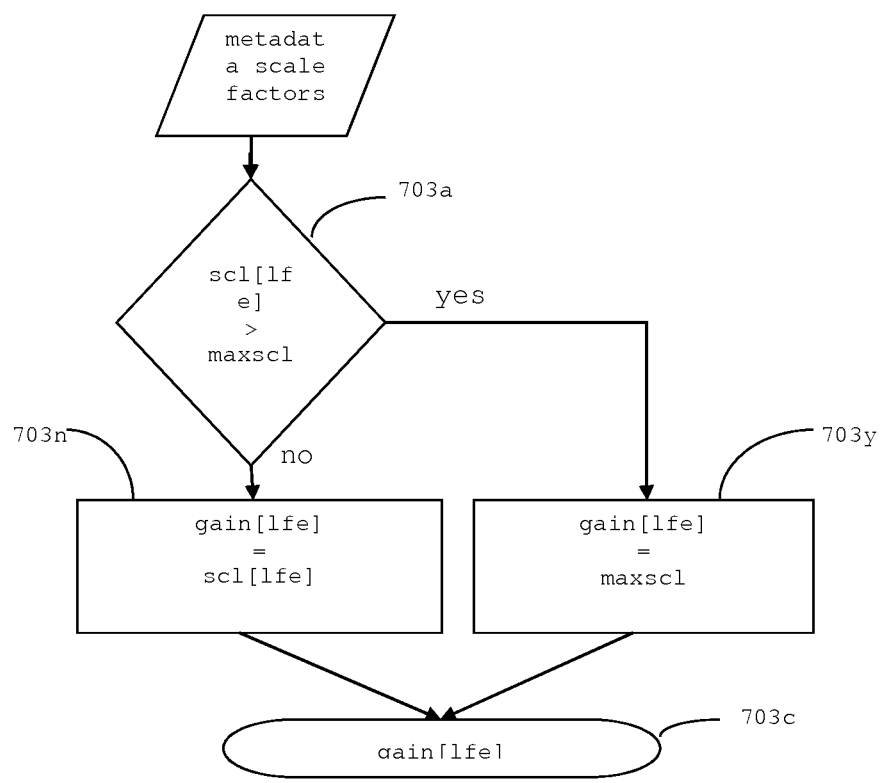
FIG. 7B: shows a flowchart for determining the scale factor for the LFE channel for step 703 of FIG. 7.

FIG. 7B shows a flowchart providing details for step 703 of FIG. 7A for the determining of the scale factor for the LFE channel relating to the example of FIG. 7A for mixing two 5.1 multi-channel signals. In step 703a, the mixing metadata for the LFE channel 646 is compared to the maximum scale factor for the other channels, maxscl, determined in step 701 of FIG. 7A. If the LFE scale factor 646 is greater than or equal to the maxscl, then in step 703y, the scale factor for the LFE channel, gain[lfe] 656, is determined to be maxscl. Otherwise, for the negative case, in step 703n, the scale factor for the LFE channel, gain[lfe] 656, is determined to be the scale factor from the mixing metadata for the LFE channel 646. Then in step 703c, gain [lfe] 656 is determined from the values calculated in steps 703y or 703n. The gain[lfe] 656, which is the scale factor to be applied to the LFE channel for mixing the signals, will then be used later in steps 707n and 707y of FIG. 7A.

Then, continuing with FIG. 7A, in step 704, pref, which is the value of the mixing balance control input 601, is compared to mainscltotal minus sclasso 648, where sclasso 648 is the scale factor for the associated signal. Note that sclasso 648 may not be present or may be ignored, in which case pref is simply is compared to mainscltotal. For example, for DD+ signals, the metadata key pgmscl corresponds to sclasso 648. If pref 602 is greater than mainscltotal minus sclasso 648, then in step 705y, the associated signal 620 is determined to be the dominant signal 206. Then in 706y, there is no gain for the associated signal, as it is the dominant signal, so the gain for the associated signal is unity, or zero dB, indicating that the associated channel is unscaled. Then in 707y, the gain for each channel of the main signal for all channels (left, right, center, left-surround, right-surround, and lfe), gainM[ch] 651, 652, 653, 654, 655 is determined as the sum of the primary scale factor, sclmain 647, and the scale factors for the normal channels scl[ch] 641, 642, 643, 644, 645 minus pref 602 minus sclasso. The calculation in 707y is repeated for all six channels of the main signal.

If the decision in step 704 is negative as pref 602 is not greater than mainscltotal, then in step 705n, the main signal is determined to be the dominant signal. Then in 706n, the gain factor for the associated signal, gainA, is determined as pref 602 minus mainscltotal plus sclasso 648. In this special case of this particular example, the main signal 610 is also scaled even though it is determined to be the dominant signal, and the scale factors 651, 652, 653, 654, 655, 656 for each channel of the main signal 620 are calculated as sclmain 647 plus the scale factor for the corresponding channels, scl[ch] 641, 642, 643, 644, 645, minus mainscltotal. Thus, in step 707n, the gain for each channel of the main signal for all channels (left, right, center, left-surround, right-surround, and lfe), gainM[ch] 651, 652, 653, 654, 655, is determined as the sum of sclmain 647 and scl[ch] 641, 642, 643, 644, 645 minus mainscltotal. The calculation in 707n is repeated for all six channels. The gains from steps 706y, 707y, 706n and 707n as well as the input signals 620, 610 are then fed into step 708, where each channel of the main 611, 612, 613, 614, 615, 616 and associated signals 621, 622, 623, 624, 625, 626 is scaled according to the determined scale factors 651, 652, 653, 654, 655, 656. Note that in the typical case, only the dominant signal is scaled, but in this special case, the non-dominant signal may also be scaled. Then in step 709, which is repeated for each of the six channels, the scaled associated 670 and scaled main signals 660 for each channel are mixed into six mixed channels 631, 632, 633, 634, 635, 636. Finally, in step 710 the six mixed channels 631, 632, 633, 634, 635, 636 are combined into a single signal to comprise the 5.1 mixed output signal 630 of step 711.

Figure 8:
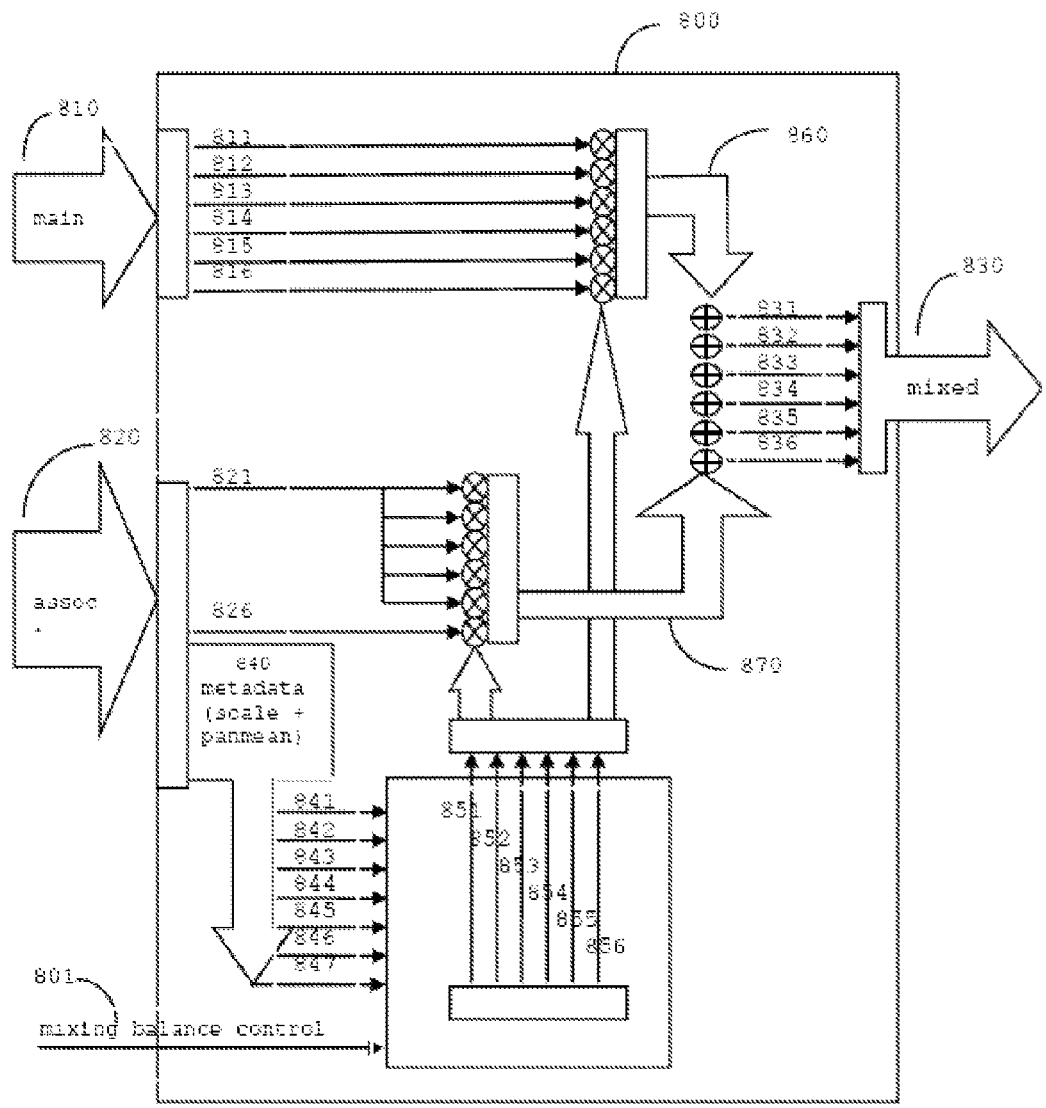
FIG. 8: shows a signal block diagram for mixing a 5.1 multi-channel main signal with a 1.1 associated signal (mono+LFE).

FIG. 8 shows a further embodiment of a mixer 800 for mixing a 5.1 multi-channel main signal 810 with a 2-channel mono+LFE associated signal 820 including mixing metadata 840, for example Dolby Digital Plus (DD+ or E-AC-3 (Enhanced AC-3)) signals. The input includes a mixing balance input 801, a main signal 810 and an associated signal 820 with mixing metadata 840. In this example, the input main signal 810 and the output mixed signal 830 are 5.1 multi-channel signals containing six channels: left, right, center, left-surround, right-surround and LFE (low-frequency effects). Thus, the main input signal 810 comprises the six channels: left 811, right 812, center 813, left-surround 814, right-surround 815 and LFE (low-frequency effects) 816. The mono+LFE associated signal 820 comprises only two channels: center 823 and LFE (low-frequency effects) 826. The mixing metadata 840 also comprises metadata with scaling values for the primary scale factor 847 and the six channels: left 841, right 842, center 843, left-surround 844, right-surround 845 and LFE (low-frequency effects) 846. The mixer 800 is also configured to receive the input from the mixing balance input 801. Based on the mixing metadata 840 and the mixing balance control input 801, a scale factor for each channel 851, 852, 853, 854, 855, 856 is determined based on the logic in the pseudo code above and also shown in FIG. 7, which is a flowchart describing how the scale for each channel is determined. From the mixing scale factors, each channel of the non-dominant input signal 207 is scaled, where the dominant signal 206 is generally not scaled at all or in special cases is only minimally scaled. The panmean value is used to pan the mono channel of the mono+LFE channel of the associated signal onto the 5.1 channels. Panmean is a value from 0 to 239 representing 0 to 358.5 degrees in 1.5 degree steps, where 0 degrees is the direction of the center speaker. For more details on applying panmean, see Section "E.4.3.5 Panning" of ETSI TS 102 366 v1.2.1. Finally, the six channel pairs for the two scaled input signals are combined pairwise for each channel into six mixed channels 831, 832, 833, 834, 835, 836. The six mixed channels 831, 832, 833, 834, 835, 836 then comprise the 5.1 mixed output signal 830. Thus, the output mixed 5.1 signal 830 also comprises six channels, left 831, right 832, center 833, left-surround 834, right-surround 835 and LFE (low-frequency effects) 836, which are each calculated according to the logic of FIG. 7.

In general, for best results, the channel mode of the mixed signal shall be the same as the decoded main audio signal, although it may of course be changed at a later stage, e.g. downmixed. For most cases, the value of the mixing balance input is expected to be small, generally up to 10 dB, although the technique supports arbitrarily large (and small) values.

In some cases, the number of channels of the main and associated signals may differ. In such a case, the techniques described herein may still be applied, where some of the input channels may have to be mapped to channels of the mixed signal that may or may not be present in the input signal. For best results, the associated signal should only contain channel locations that are also present in the main signal, unless the associated signal is mono (acmod 1), or the channels of the associated signal can be otherwise appropriately mapped to channels of the main signal. Likewise, a low-frequency effects channel (LFE) should preferably only be present in the associated signal if the main signal also contains an LFE channel. Otherwise, the LFE channel of the associated signal should be ignored in the mixing process. Likewise, if the associated signal is mono+LFE, the LFE should preferably be mixed on the main audio LFE and the mono should preferably be panned on the main channels of main audio signal.

In general, it is preferable for the mixing process that the input signals are normalized. The normalization can be applied either before or after the determination of the dominant signal, as the results will be the same. In practice, it is preferable to ensure that the content dialnorm value of the input signals is set correctly and for both the main and associated signals to be at dialog level 31 before mixing. Subsequently, the level of the dominant signal, which is considered the "signal in focus", shall ideally also exit the mixer at dialnorm 31. If the input signals are not normalized, then normalization should generally be performed prior to mixing, although the techniques can also be applied without normalization and the mixed signal then normalized, if necessary.

When mixing multi-channel signals, the relations between scl[ch] shall be preferably maintained in the outgoing signal. However, if scl[lfe] has a higher value than all other scl[ch] (transmitted or zero by default), it shall be modified towards the maximum value of the other scl[ch].

It should be noted that for Dolby Pulse signals the mixing metadata is typically included in the Sub Audio stream, as defined in Section "E.2" of ETSI TS 101 154 V1.9.1 and ETSI TS 102 366 V1.2.1, Annex E. (also see DVB blue book A0001 r8). Regardless of how the metadata is transmitted or packed in the stream signal, the techniques described herein can still be applied as long as the mixing metadata is available. Thus, the described embodiments and examples may have to be adapted appropriately to handle such a case.

The above example with an associated track containing director's comments is only one example. The described techniques can however be applied to any mixture of main and associated signals, regardless of the content of contained in the signals. For example, the first signal could contain a live sports program where the second signal provides local commentary and or commentary in an alternate language. Here there are multiple possibilities as to how the signals could be distributed. For example, the first signal could be the general sound track without commentary and the second signal could be local commentary.

A further use case for the techniques described herein could relate to a separate track for the hard of hearing, where the associated signal contains special enhancements to improve the understandability of the dialog. Similarly, as an aid for visually impaired viewers, the associated signal could contain spoken explanation of scene contents.

However, the techniques described herein are not limited solely to dialog, but can also be applied to all types of audio signals such as music, as the techniques are based on the perceived sound level. For example, relating to music an associated track could contain a voice or additional overlay instrument track for music; in other words, the main track could be the basic instrumental track with say only piano and acoustic guitar, a first associated track could contain a voice overlay, a second associated track rock music with electric and bass guitar and a third track with a techno overlay with a hard fast bass beat. In this case, the content author would have the opportunity to specify the desired mixing characteristics specifying how each associated track is to be mixed, and the techniques described herein would allow for the listener to customize these settings by adjusting the balance input for the mixed signals. As another example, the techniques could also be applied to a music signal where different channels contain different musical aspects such as instruments like strings or percussion and vocals, where different channels are mixed via metadata and a mixing balance input.

The techniques described herein rely on the determination of the dominant signal in the mixed signal. Thus, the signal that is determined to be the dominant signal receives the highest composite gain. In addition to maintaining a constant perceived sound level of the mixed signal through the use of the mixing balance input control, the user can control the mixing balance at all times. Furthermore, gain changes are also smooth throughout the entire range.

Although the techniques described herein have been illustrated with specific examples, such as mixing multi-channel signals containing dialog tracks, these techniques should not be limited to these examples or embodiments as the techniques can be equally applied to a situation where the main and associated signals have a very different composition, as long as the mixing metadata and the mixing balance input can be used to determine the dominant signal for the mixed signal.

In the present document, various methods and arrangements for mixing audio signals have been described. Using these methods and/or devices such as signal mixers, it is possible to maintain a consistent perceived sound level for a mixed signal while allowing for adjustment of the balance between the main and associated signal. The methods may be performed without sampling or analysis of the input signals or high-powered processing, as the calculations may be easily performed in real-time using the metadata accompanying the input signals by relatively simple and basic electronic devices.

It should be noted that the description and drawings merely illustrate the principles of the proposed methods and systems. It will thus be appreciated that those skilled in the art will be able to devise various arrangements that, although not explicitly described or shown herein, embody the principles of the proposed methods and systems and are considered to be part of the disclosure of this document. Furthermore, all statements herein reciting principles, aspects, and embodiments of the proposed methods and devices, as well as specific examples thereof, are intended to encompass equivalents thereof.

Furthermore, all examples recited herein are principally intended expressly to be only for pedagogical purposes to aid the reader in understanding the principles of the proposed methods and devices and the concepts contributed by the inventors to furthering the art, and are to be construed as being without limitation to such specifically recited examples and conditions.

Furthermore, it should be noted that any block diagrams herein represent conceptual views of illustrative devices embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The invention claimed is:

1. A method for mixing two input audio signals into a single, mixed audio signal while maintaining a perceived sound level of the mixed audio signal, the method comprising:
    receiving a main input audio signal;
    receiving an associated input audio signal; wherein the associated input audio signal is coupled with the main input audio signal;
    receiving mixing metadata, which contains scaling information for scaling the main input audio signal and which specifies how the main input audio signal and the associated input audio signal should be mixed, in order to generate a mixed audio signal at the perceived sound level; wherein the scaling information from the mixing metadata comprises a metadata scale factor for the main input audio signal, for scaling the main input audio signal relative to the associated input audio signal;
    receiving a mixing balance input, which denotes an adjustable balance between the main input audio signal and the associated input audio signal, wherein the mixing balance input comprises scaling information which allows a deviation from a weighting of the main input audio signal and the associated input audio signal in the mixed audio signal as specified in the mixing metadata;
    identifying a dominant signal as either the main input audio signal or the associated input audio signal from the scaling information provided by the mixing metadata and from the mixing balance input, wherein the respective other input audio signal is then identified as a non-dominant signal; and wherein the dominant signal is identified by comparing the mixing balance input with the metadata scale factor for the main input audio signal;
    scaling the non-dominant signal in relation to the dominant signal; and
    combining the scaled non-dominant signal with the dominant signal to yield the mixed audio signal.

2. The method of claim 1 further comprising:
    determining a scale factor for the scaling of the non-dominant signal based on the scaling information from the mixing metadata and based on the mixing balance input;
    wherein the determined scale factor is used for the scaling of the non-dominant signal.

3. The method of claim 1, wherein
    if the value of the mixing balance input is greater than the metadata scale factor for the main input audio signal from the mixing metadata,
    then the associated input audio signal is determined to be the dominant signal;
    otherwise, the main input audio signal is determined to be the dominant signal.

4. The method of claim 1, wherein if the associated input audio signal is identified to be the dominant signal, the method further comprises:
    calculating the scale factor for the main input audio signal as the metadata scale factor for the main input audio signal from the mixing metadata minus the value of the mixing balance input.

5. The method of claim 1, wherein if the main input audio signal is identified to be the dominant signal, the method further comprises:
    calculating the scale factor for the associated input audio signal as the value of the mixing balance input minus the metadata scale factor from the mixing metadata for the main input audio signal.

6. The method of claim 1 where the mixing metadata is contained in the associated input audio signal.

7. The method of claim 1, wherein the main input audio signal comprises multiple audio channels.

8. The method of claim 7, wherein the mixing metadata further comprises:
    a primary metadata scale factor for the main input audio signal relative to the associated input audio signal; and
    one or more channel metadata scale factors for different channels of the main input audio signal relative to the associated input audio signal.

9. The method of claim 8, wherein the dominant signal is identified by comparing the value of the mixing balance input with the primary and channel metadata scale factors for the main input audio signal, and
    if the value of the mixing balance input is greater than the sum of the primary metadata scale factor for the main input audio signal plus the maximum of all the channel metadata scale factors for all the channels of the main input audio signal,
    then the associated input audio signal is determined to be the dominant signal;
    otherwise, the main input audio signal is determined to be the dominant signal.

10. The method of claim 8, where the mixing metadata for the associated input audio signal further comprises pan metadata information, the associated input audio signal comprises a mono signal and the main input audio signal comprises a stereo or multi-channel signal,
    wherein the associated input audio signal is mixed with the channels of the main input audio signal according to the pan metadata information.

11. The method of claim 1, wherein the perceived sound level is based on an average weighted level of the main input audio signal and the associated input audio signal.

12. The method of claim 1, wherein the perceived sound level is based on a dialog level of the main input audio signal and the associated input audio signal.

13. The method of claim 1, wherein the main input audio signal and the associated input audio signal are encoded as Dolby Digital Plus "DD+", Dolby Pulse signals, E-AC-3, MPEG-4 HE-AAC, aacPlus, AC-3, MPEG-1 Layer 2, MPEG-4 AAC or any derivation of MPEG-4 audio signals.

14. The method of claim 1, wherein the mixing balance input comprises an external user input providing a value from negative values to positive values.

15. A non-transitory processor-readable storage medium that stores computer-readable instructions to execute the method of claim 1.

16. A device for mixing input audio signals into a single, mixed audio signal while maintaining a perceived sound level of the mixed audio signal, comprising:
    a receiver for receiving a main input audio signal, an associated input audio signal and mixing metadata; wherein the associated input audio signal is coupled with the main input audio signal; wherein the mixing metadata contains scaling information for scaling the main input audio signal; wherein the scaling information specifies how the main input audio signal and the associated input audio signal should be mixed, in order to generate a mixed audio signal at the perceived sound level; wherein the scaling information from the mixing metadata comprises a metadata scale factor for the main input audio signal, for scaling the main input audio signal relative to the associated input audio signal;

a mixing balance input, which denotes the adjustable balance between the main and the associated input audio signals; wherein the mixing balance input comprises scaling information which allows a deviation from a weighting of the main input audio signal and the associated input audio signal in the mixed audio signal as specified in the mixing metadata; and a mixing unit configured to identify a dominant signal as either the main input audio signal or the associated input audio signal from the scaling information provided by the mixing metadata and from the mixing balance input, wherein the respective other input audio signal is then identified as a non-dominant signal; and wherein the dominant signal is identified by comparing the mixing balance input with the metadata scale factor for the main input audio signal;

wherein the mixing unit is further configured to scale the non-dominant signal in relation to the dominant signal; and to combine the scaled non-dominant signal with the dominant signal to yield the mixed audio signal.

17. The device of claim 16, wherein the scale factor for the non-dominant signal is determined directly from the scaling information from the mixing metadata and the mixing balance input;

the non-dominant signal is scaled using the determined scale factor; and the scaled non-dominant signal is combined with the dominant signal into the mixed signal.

18. The device of claim 16, wherein the mixing metadata is integrated with the associated input audio signal.

19. The device of claim 16, wherein the mixing balance input further comprises an external user input providing a value from negative values to positive values.

20. The device of claim 16 wherein the receiver is further configured to receive multi-channel main input audio and associated input audio signals and the mixing unit is configured to mix the multi-channel main input audio and associated input audio signals.

* * * * *